(12) United States Patent
Kim et al.

(10) Patent No.: US 11,777,467 B2
(45) Date of Patent: Oct. 3, 2023

(54) AIR-GAP TYPE FILM BULK ACOUSTIC RESONATOR

(71) Applicant: WISOL CO., LTD., Gyeonggi-do (KR)

(72) Inventors: Byung Hun Kim, Gyeonggi-do (KR); Yong Hun Ko, Gyeonggi-do (KR); A Young Moon, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 458 days.

(21) Appl. No.: 17/081,063

(22) Filed: Oct. 27, 2020

(65) Prior Publication Data

US 2021/0126610 A1 Apr. 29, 2021

(30) Foreign Application Priority Data

Oct. 28, 2019 (KR) .................. 10-2019-0134779

(51) Int. Cl.
*H03H 9/02* (2006.01)
*H03H 9/17* (2006.01)
*H03H 9/13* (2006.01)

(52) U.S. Cl.
CPC ........ *H03H 9/02086* (2013.01); *H03H 9/132* (2013.01); *H03H 9/173* (2013.01)

(58) Field of Classification Search
CPC ..... H03H 9/02086; H03H 9/132; H03H 9/173
See application file for complete search history.

(56) References Cited

U.S. PATENT DOCUMENTS

| 2006/0001508 | A1* | 1/2006 | Ohara | ............... H03H 9/02133 333/191 |
| 2007/0188270 | A1* | 8/2007 | Ohara | .................. H03H 9/605 333/189 |
| 2013/0049545 | A1* | 2/2013 | Zou | ......................... H03H 3/04 310/346 |
| 2015/0318837 | A1* | 11/2015 | Zou | .................... H03H 9/02086 333/187 |
| 2018/0062608 | A1* | 3/2018 | Lee | .................... H03H 9/02157 |
| 2018/0183406 | A1* | 6/2018 | Patil | ....................... H03H 9/173 |
| 2018/0351533 | A1* | 12/2018 | Lee | ........................ H03H 9/174 |

FOREIGN PATENT DOCUMENTS

KR 10-2004-0102390 A 12/2004

* cited by examiner

*Primary Examiner* — Bryan P Gordon
(74) *Attorney, Agent, or Firm* — Harness, Dickey & Pierce, P.L.C.

(57) ABSTRACT

An air-gap type film bulk acoustic resonator (FBAR) is provided. The air-gap type FBAR includes a substrate which comprises an air gap portion having a substrate cavity formed in a top surface, a lower electrode formed on the substrate, a piezoelectric layer which is formed on the lower electrode and has one side forming an edge portion in the vicinity of a virtual edge according to vertical projection of the air gap portion, an upper electrode formed on the piezoelectric layer, a first electrode frame which comprises an open ring structure in plane, the open ring structure surrounding a part of a periphery of the piezoelectric layer on the lower electrode, and a second electrode frame positioned on the upper electrode and adjacent to an open portion of the open ring structure.

16 Claims, 11 Drawing Sheets

AIR-GAP TYPE FILM BULK ACOUSTIC RESONATOR

CROSS-REFERENCE TO RELATED APPLICATION

This application claims the benefit under 35 USC § 119(a) of Korean Patent Application No. 10-2019-0134779, filed on Oct. 28, 2019, in the Korean Intellectual Property Office, the entire disclosure of which is incorporated herein by reference for all purposes.

FIELD

The present invention relates to a resonator used for communication in a radio frequency (RF) band, and more particularly, to an air-gap type thin film bulk acoustic resonator (FBAR).

BACKGROUND

A wireless mobile communication technology requires diverse radio frequency (RF) parts that can efficiently transmit information in a limited frequency band. Particularly, a filter among RF parts is essential for use in mobile telecommunication technology, which makes high-quality communication possible by selecting a signal needed by a user among a plurality of frequency bands or by filtering a signal that is to be transmitted.

Currently, the RF filter most widely used for wireless communication is a dielectric filter and a surface acoustic wave (SAW) filter. A dielectric filter is advantages in that it provides high dielectric permitivity, low insertion loss, stability at high temperatures and is robust to vibration and shock. However, the dielectric filter has limitations in miniaturization and application to monolithic microwave integrated circuit (MMIC) which are recent trends in the technology development. In contrast, a SAW filter is advantageous in that it provides a small size, facilitates processing signals, has a simplified circuit, and can be mass-produced using semiconductor processes. Further, the SAW filter provides a high side rejection in a passband compared to the dielectric filter, allowing it to transmit and receive high-quality information. The SAW filter, however, has a drawback in that inter-digital transducer (IDT) line width is limited to about 0.5 μm, because the process for fabricating the SAW filter includes exposure to ultraviolet (UV) light. Accordingly, the SAW filter cannot cover the high frequency bands, e.g., over 5 GHz. Further, it is still difficult to integrate a SAW filter with the MMIC structure on a semiconductor substrate as a single chip.

In order to overcome the limits and problems as above, a film bulk acoustic resonance (FBAR) filter has been proposed in which a frequency control circuit can be completely constructed in the form of MMIC with other active devices integrated together on an existing Si or GaAs semiconductor substrate.

The FBAR is a thin film device that is low-priced, small-sized, and can be designed to have a high-Q factor. Thus, the FBAR filter can be used in wireless communication equipment of various frequency bands, for example, ranging from 900 MHz to 10 GHz and military radar. Also, the FBAR can be made an order of magnitude smaller than a dielectric filter or a lumped constant (LC) filter and has a very low insertion loss compared to the SAW filter. Accordingly, the FBAR may be the most adequate device that can be integrated with the MMIC which requires a high stability and a high quality factor (Q-factor).

The FBAR filter is formed by depositing zinc oxide (ZnO), aluminum nitride (AlN), or the like, which is a piezoelectric dielectric material, on a Si or GaAs semiconductor substrate through RF sputtering. The resonance of the FBAR filter arises from the piezoelectric characteristics of the piezoelectric material used therein. More particularly, the FBAR filter includes a piezoelectric film disposed between two electrodes, and generates bulk acoustic waves to induce resonance.

A variety of FBAR structures have been studied so far. In a membrane type FBAR, a silicon oxide ($SiO_2$) layer is deposited on a substrate and a membrane layer is formed using a cavity formed by isotropic-etching an opposite side of the substrate. Then, a lower electrode is formed on the $SiO_2$ layer, a piezoelectric material is deposited on the lower electrode using an RF magnetron sputtering method to form a piezoelectric layer, and an upper electrode is formed on the piezoelectric layer.

The above membrane-based FBAR provides a low dielectric loss of the substrate and less power loss due to the cavity. However, the membrane based FBAR occupies a large area due to the orientation of the silicon substrate, and is easily damaged due to the low structural stability upon a subsequent packaging process, resulting in low yield. Accordingly, recently, air gap-type and Bragg reflector-based FBARs have been created to reduce the loss due to the membrane and simplify the device manufacturing process.

The Bragg-reflector type FBAR is formed by stacking in order of a reflection layer, a lower electrode, a piezoelectric layer, and an upper electrode, wherein the reflection layer is formed by depositing, on a substrate, materials having a large difference of elastic impedance in an alternate manner. Thus-structured Bragg reflection-type FBAR elements can effectively generate the resonance since all elastic acoustic wave energy passed through the piezoelectric layer is not transferred to the substrate, but reflected at the reflection layer. The Bragg reflector-type FBAR is sturdy in structure and does not exhibit stress upon being bent, but has a drawback in that it is difficult to precisely form more than four reflection layers for total reflection and much time and expense is required for its fabrication.

On the other hand, a conventional air gap-type FBAR having a structure that uses an air gap instead of the reflection layer to separate the substrate from the resonance part realizes FBAR by isotropic-etching the surface of the silicon substrate to form a sacrificial layer, surface polishing using chemical mechanical planarization (CMP), then sequentially depositing an insulating layer, a lower electrode, a piezoelectric layer, and an upper electrode, and removing the sacrificial layer through a via hole to form the air gap.

In the related art, a piezoelectric layer is sandwiched between upper and lower electrodes in the FBAR structure, and installing the upper and lower electrodes in an area where such a piezoelectric layer is required enables the piezoelectric effect. Therefore, the conventional FBAR structure has a high mechanical anchor loss, which causes mechanical energy decrease.

The upper electrode or the lower electrode may be formed of a material, such as Mo, Ru, W, and the like, to increase the acoustic impedance. A skin depth of an electrode material depends on a frequency of a filter. Generally, an electrode layer has a thickness much thinner than the skin depth and hence the electric charge charged at a resonance point of a piezoelectric layer cannot be sufficiently transferred through the lead, which causes a decrease in quality factor.

RELATED ART

Patent Document

Korean Patent Publication No. 10-2004-0102390 (published on Dec. 8, 2004)

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to an air-gap type film bulk acoustic resonator (FBAR) capable of reducing an anchor loss (mechanical loss) while improving a quality factor, in which a piezoelectric layer is formed to conform to the edges of a resonator, a first electrode frame is formed on a lower electrode and the piezoelectric layer, and a second electrode frame is formed on an upper electrode.

According to one aspect of the present invention, An air-gap type FBAR includes a substrate which comprises an air gap portion having a substrate cavity formed in a top surface, a lower electrode formed on the substrate, a piezoelectric layer which is formed on the lower electrode and has one side forming an edge portion in the vicinity of a virtual edge according to vertical projection of the air gap portion, an upper electrode formed on the piezoelectric layer, a first electrode frame which comprises an open ring structure in plane, the open ring structure surrounding a part of a periphery of the piezoelectric layer on the lower electrode, and a second electrode frame positioned on the upper electrode and adjacent to an open portion of the open ring structure.

The open ring structure may surround a part of the virtual edge according to the vertical projection of the air gap portion and the second electrode frame may be spaced a predetermined distance from the first electrode frame and surround the remaining portion of the virtual edge.

The first electrode frame may include the open ring structure which is formed on the lower electrode and spaced apart from an edge portion of the upper electrode and surrounds the virtual edge.

The first electrode frame may include the open ring structure having the edge portion positioned along the virtual edge.

The open ring structure may include two hook portions bent to face each other at both ends thereof and an edge portion of the second electrode frame may be positioned between the hook portions.

The first electrode frame may include a first frame extension portion formed on a lower electrode extension portion of the lower electrode that extends for connection with the outside.

An edge portion of the second electrode frame may be positioned along the virtual edge.

The second electrode frame may include a second frame extension portion formed on an upper electrode extension portion of the upper electrode that extends for connection with the outside.

The first electrode frame may be formed on the lower electrode and when the piezoelectric layer extends beyond the virtual edge and completely surrounds the air gap portion, an edge portion of the first electrode frame may be spaced a predetermined distance from the edge portion of the piezoelectric layer.

The piezoelectric layer may further include a cavity portion including a piezoelectric cavity formed between the lower electrode and the upper electrode and the cavity portion may be formed on a lower portion of an edge portion of the upper electrode.

The cavity portion may be a first cavity portion including a first piezoelectric cavity having an exposed upper surface formed to expose a part of a lower section of the edge portion of the upper electrode and a closed lower surface formed to not expose an upper section of the lower electrode.

The piezoelectric layer may further include a second cavity portion including a second piezoelectric cavity formed to be spaced a predetermined distance from the first cavity portion.

The second piezoelectric cavity may have a closed lower surface formed to not expose an upper section of the lower electrode and an exposed upper surface formed to allow an entire upper portion to be open.

The first electrode frame may include an edge portion which is coincident with a boundary wall of one side of the second piezoelectric cavity when the piezoelectric layer extends beyond the virtual edge and completely surrounds the air gap portion.

The air-gap type FBAR may further include an air bridge which includes an air cavity formed on one side of the virtual edge according to the virtual projection of the air gap portion.

The piezoelectric layer may include the edge portion formed vicinity of the virtual edge according to the virtual projection of the air gap portion and further include an extended piezoelectric layer which is spaced a predetermined distance or more apart from the edge portion and extends, and the first electrode frame may be formed on the extended piezoelectric layer as well as on the piezoelectric layer and the lower electrode.

Other features and aspects will be apparent from the following detailed description, the drawings, and the claims.

Figure 1:
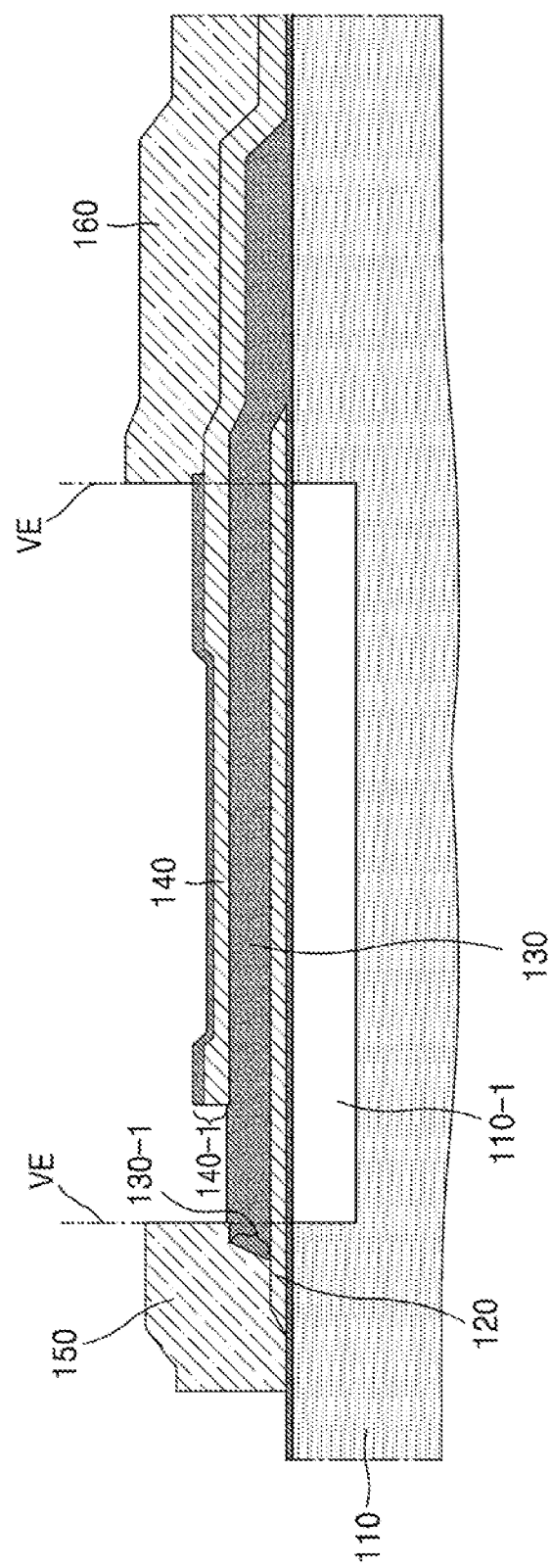
FIG. 1 is a cross-sectional view of a first embodiment of an air-gap type film bulk acoustic resonator (FBAR) according to the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, exemplary embodiments of the present invention will be described in detail with reference to the attached drawings.

The embodiments of the present invention are provided to more completely explain the present invention to one of ordinary skill in the art. The following embodiments may be modified into a variety of different forms, and the scope of the present invention is not limited thereto. The embodiments are provided to make the disclosure more substantial and complete and to completely convey the concept of the present invention to those skilled in the art.

The terms used herein are to explain particular embodiments and are not intended to limit the present invention. As used herein, singular forms, unless contextually defined otherwise, may include plural forms. Also, as used herein, the term "and/or" includes any and all combinations or one of a plurality of associated listed items. Hereinafter, the embodiments of the present invention will be described with reference to the drawings which schematically illustrate the embodiments.

Figure 2:
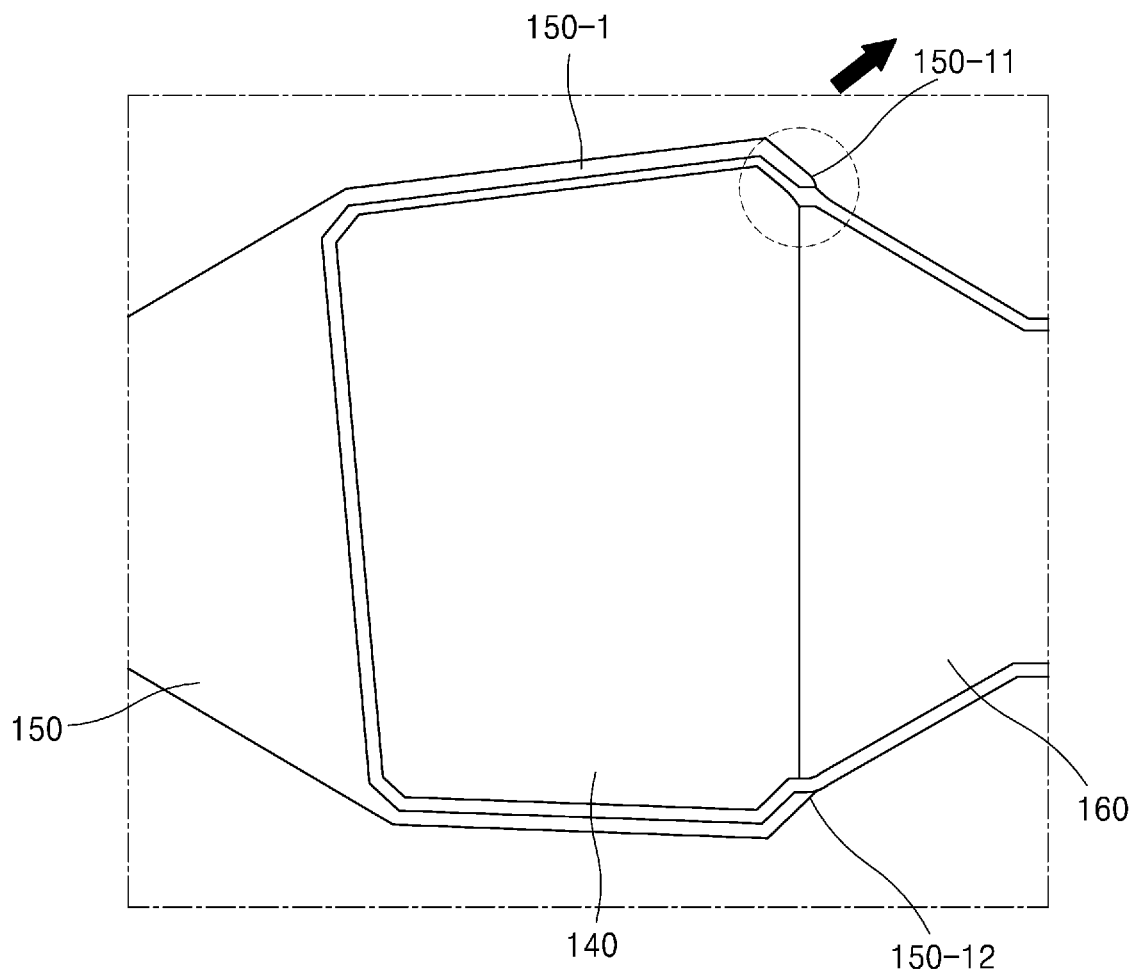
FIG. 2 is a top view of the air-gap type FBAR shown in FIG. 1.
Figure 3:
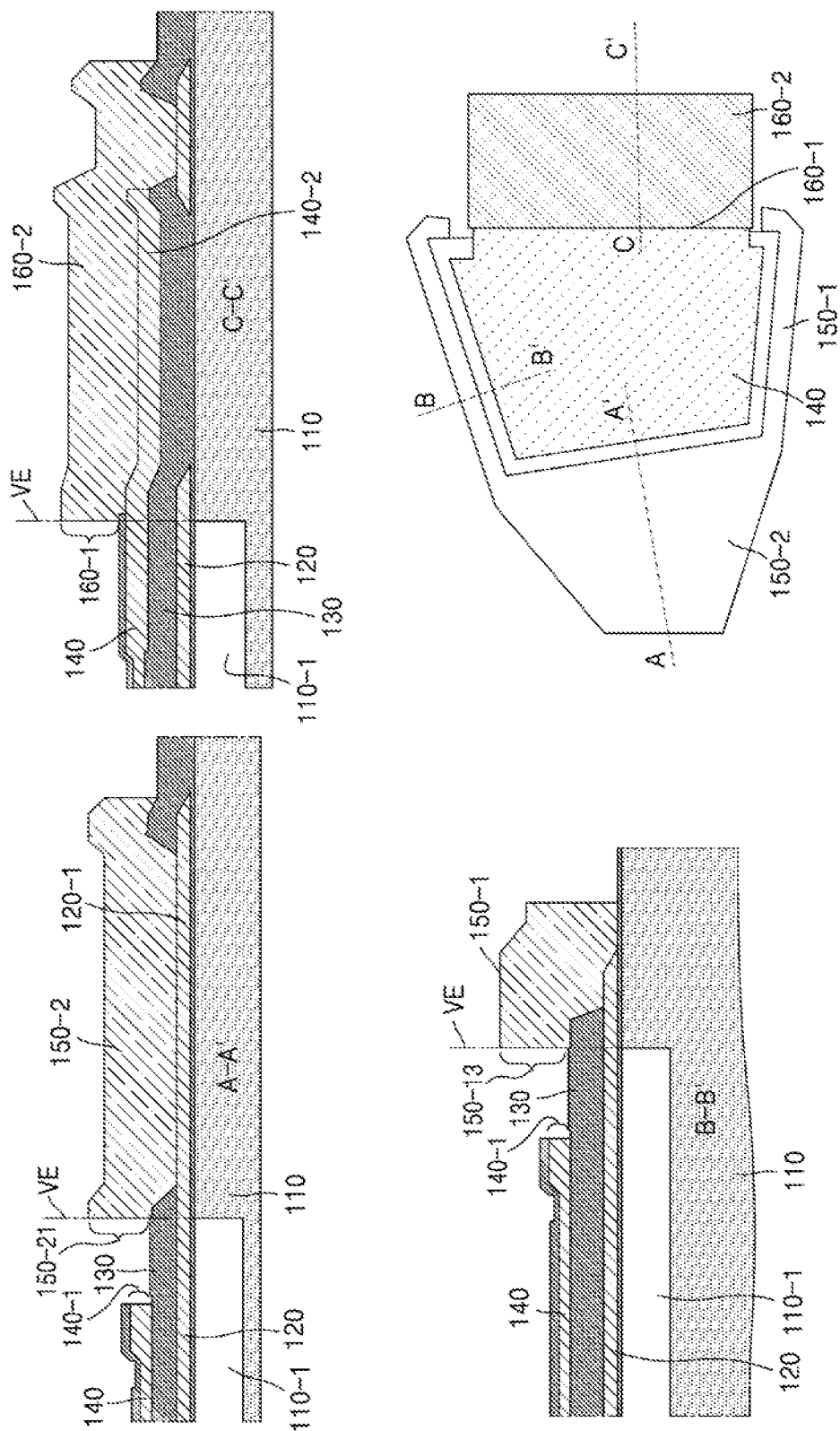
FIG. 3 is a vertical cross-sectional view of each side of the air-gap type FBAR shown in FIG. 1.

FIG. 1 is a cross-sectional view of a first embodiment of an air-gap type film bulk acoustic resonator (FBAR) 100 according to the present invention, FIG. 2 is a top view of the air-gap type FBAR 100 shown in FIG. 1, and FIG. 3 is a vertical cross-sectional view of each side of the air-gap type FBAR 100 shown in FIG. 1.

Referring to FIGS. 1 to 3, the air-gap type FBAR 100 according to the first embodiment includes a substrate 110, an air gap portion 110-1, a lower electrode 120, a piezoelectric layer 130, an upper electrode 140, a first electrode frame 150, and a second electrode frame 160.

In the air-gap type FBAR 100, if an external signal is applied between the lower electrode 120 and the upper electrode 140, part of the electric energy delivered between the two electrodes is converted to mechanical energy due to the piezoelectric effect. During the process for converting such mechanical energy back to electric energy, resonance occurs with respect to a frequency of proper vibration depending on the thickness of the piezoelectric layer 130.

The substrate 110, which is a semiconductor substrate, may be a general silicon wafer, and preferably a high resistivity silicon (HRS) substrate. An insulating layer (not shown) may be formed on a top surface of the substrate 100. The insulating layer may include a thermal oxide film that can be easily grown on the substrate 100, or may optionally include an oxide film or a nitride film that is formed using a general deposition process, such as chemical vapor deposition.

The air gap portion 110-1 is formed as follows. A substrate cavity is formed in the substrate 110, and an insulating layer is formed in the substrate cavity. A sacrificial layer is deposited on the insulating layer and then planarized by etching, and then finally removed to form the air gap. Here, for the sacrificial layer, a material that has a high surface roughness and can be easily formed and removed, such as tetraethyl orthosilicate (TEOS), phophosilicate glass (PSG), or the like, is used. For example, poly silicon may be employed for the sacrificial layer. Such poly silicon may have an excellent surface roughness and enable easy formation and removal of the sacrificial layer, and particularly, can be removed by applying dry etching in a subsequent process.

The lower electrode 120 is formed on the air gap portion 110-1 in which the sacrificial layer is present in the substrate cavity. The lower electrode 120 is formed by depositing and patterning a predetermined material on the substrate 110. For the lower electrode 120, a general conductive material, such as metal, is used, and it may be preferable to use one of aluminum (Al), tungsten (W), gold (Au), platinum (Pt), nickel (Ni), chrome (Cr), titan (Ti), palladium (Pd), ruthenium (Ru), rhenium (Re), and molybdenum (Mo). A thickness of the lower electrode 120 may be from 10 to 1000 nm.

The piezoelectric layer 130 is formed on the lower electrode 120. The piezoelectric layer 130 may be formed by depositing and patterning a piezoelectric material on the lower electrode 120. For the piezoelectric material, AlN or ZnO may be used. The deposition method may include an RF magnetron sputtering method, an evaporation method, and the like. The thickness of the piezoelectric layer 130 may be 5 to 500 nm.

The piezoelectric layer 130 is formed on the lower electrode 120, and at this time, an edge portion 130-1 of the piezoelectric layer 130 is formed only to the vicinity of a virtual edge VE according to the vertical projection of the air gap portion 110-1, unlike in the related art. The edge portion 130-1 of the piezoelectric layer 130 may have a slanted shape and a slant angle thereof may be about 30 degrees.

The piezoelectric layer 130 may include a cavity portion in which a piezoelectric cavity is formed between the lower electrode 120 and the upper electrode 140. Here, the cavity portion may be formed under an edge portion that corresponds to an end of the upper electrode 140. Details of the cavity portion will be described below.

The upper electrode 140 is formed on the piezoelectric layer 130. If the cavity portion is formed in the piezoelectric layer 130 and the sacrificial layer is formed therein, the upper electrode 140 may be formed also on a portion of the sacrificial layer. The upper electrode 140 may be formed by depositing and patterning a metallic film for the upper electrode on a predetermined region of the piezoelectric layer 130. The upper electrode 140 and the lower electrode 120 may be formed of the same material by using the same deposition method and patterning method. A thickness of the upper electrode 400 may be from 5 to 1000 nm.

An edge portion 140-1 is formed at one end of the upper electrode 140. The edge portion 140-1 may be an electrode structure having a relatively thick electrode thickness compared to other portions of the electrode structures constituting the upper electrode 140. The edge portion 140-1, which corresponds to an edge frame of the upper electrode 140, functions to prevent energy from escaping through a side portion.

Meanwhile, a pad layer to be applied to portions of the lower electrode 120, the piezoelectric layer 130, and the upper electrode 140 described above may be formed. The pad layer serves as a cover for protecting the lower electrode 120, the piezoelectric layer 130, and the upper electrode 140.

The first electrode frame 150, which corresponds to an electrode frame formed on the lower electrode 120, has an open ring structure in plane. A first electrode frame 150 for reinforcing an electrode is formed on the lower electrode Mo or Ru that is exposed by removing the piezoelectric layer 130 from an upper portion of the lower electrode extending beyond the air gap portion 110-1. Metal used for forming the first electrode frame 150 is Cu, Au, AlCu, Mo, or the like, and the first electrode frame 150 is formed with a height and a width that are sufficiently larger than a skin depth and is formed around the peripheries of the lower electrode 120 and the piezoelectric layer 130. As a metal used for the first electrode frame 150, a material that has smaller conductivity than that of the electrode material Mo or RU and has an acoustic impedance significantly different from AlN of the used piezoelectric layer 130 may be selected. Before the first electrode frame 150 is formed on the lower electrode 120, chromium (Cr) and nickel chromium (NiCr) are first formed as metal barriers.

Referring to FIG. 2, a planar shape of the first electrode frame 150 is formed to surround the periphery of the piezoelectric layer 130 on the lower electrode 120. To this end, the first electrode frame 150 has a ring shape with one side partially open, that is, an open ring structure (or hook structure) 150-1.

The open ring structure 150-1 includes two hook portions 150-11 and 150-12 bent to face each other at both ends thereof.

The hook portions 150-11 and 150-12 are bent and extended at both ends of the open ring structure 150-1, and they are bent in a direction to face each other, thereby forming a shape that surrounds the upper electrode 140. In this case, the hook portions 150-11 and 150-12 may be extended in a straight line or in a curved shape.

The first electrode frame 150 includes a first frame extension portion that is positioned above a lower electrode extension portion of the lower electrode 120 that is extended for connection with the outside.

Referring to a side cross-sectional view in the direction of A-A' shown in FIG. 3, the first frame extension portion 150-2 of the first electrode frame 150 is formed on the lower electrode extension portion 120-1 of the lower electrode 120 that is extended for connection with the outside. The first frame extension portion 150-2 may surround the lower electrode extension portion 120-1 in such a manner that covers the entire lower electrode extension portion 120-1, or may surround only a part of the lower electrode extension portion 120-1.

The open ring structure 150-1 of the first electrode frame 150 surrounds a part of the virtual edge according to vertical projection of the air gap portion 110-1.

Referring to side cross-sectional views of the first electrode frame 150 in each direction (A-A' and B-B') shown in FIG. 3, the open ring structure 150-1 of the first electrode frame 150, which is formed on the lower electrode 120, is spaced apart from the edge portion 140-1 of the upper electrode 140 formed on the air gap portion 110-1 and surrounds the virtual edge VE according to the vertical projection of the air gap portion 110-1.

At this time, referring to a side cross-sectional view in the direction of B-B', an edge portion 150-13 of the open ring structure 150-1 is located at a position corresponding to the virtual edge VE of the air gap portion 110-1. In addition, referring to the side cross-sectional view in the direction of A-A', an edge portion 150-21 of the first frame extension portion 150-2 is located at a position corresponding to the virtual edge VE of the air gap portion 110-1. Here, the edge portions 150-13 and 150-21 of the open ring structure 150-1 may each be formed as a vertical boundary wall.

The open ring structure 150-1 and the first frame extension portion 150-2 of the first electrode frame 150 are spaced at a predetermined distance from the edge portion 140-1 of the upper electrode 140 and are positioned along the virtual edge VE of the air gap portion 110-1. Referring to FIG. 3, it can be seen that in the B-B' side cross-sectional view, the edge portion 150-13 of the open ring structure 150-1 is spaced apart from the edge portion 140-1 of the upper electrode 140, and in the A-A' side cross-sectional view, the edge portion 150-21 of the first frame extension portion 150-2 is spaced apart from the edge portion 140-1 of the upper electrode 140.

The second electrode frame 160 is positioned on the upper electrode 140 and adjacent to the open portion of the open ring structure 150-1 that forms the first electrode frame 150. Here, the second electrode frame 160 includes an edge portion to surround the portion of the virtual edge VE of the air gap portion 110-1, other than the portion surrounded by the edge portions 150-13 and 150-21 of the first electrode frame 150.

Metal used for forming the second electrode frame 160 is Cu, Au, AlCu, Mo, or the like, and the second electrode frame 160 is formed with a height and a width that are sufficiently larger than the skin depth and is formed on the upper electrode 140. Before the second electrode frame 160 is formed on the upper electrode 140, Cr and NiCr are first formed as metal barriers.

Referring to a side cross-sectional view in the direction C-C' shown in FIG. 3, an edge portion 160-1 of the second electrode frame 160 is located at a point corresponding to the virtual edge VE of the air gap portion 110-1.

The edge portion 160-1 of the second electrode frame 160 is spaced at a predetermined distance D from each of the ends of the hook portions 150-11 and 150-12 constituting the first electrode frame 150 and surrounds the virtual edge VE of the air gap portion 110-1. Here, the edge portion 160-1 of the second electrode frame 160 may be formed as a vertical edge barrier.

Figure 4:
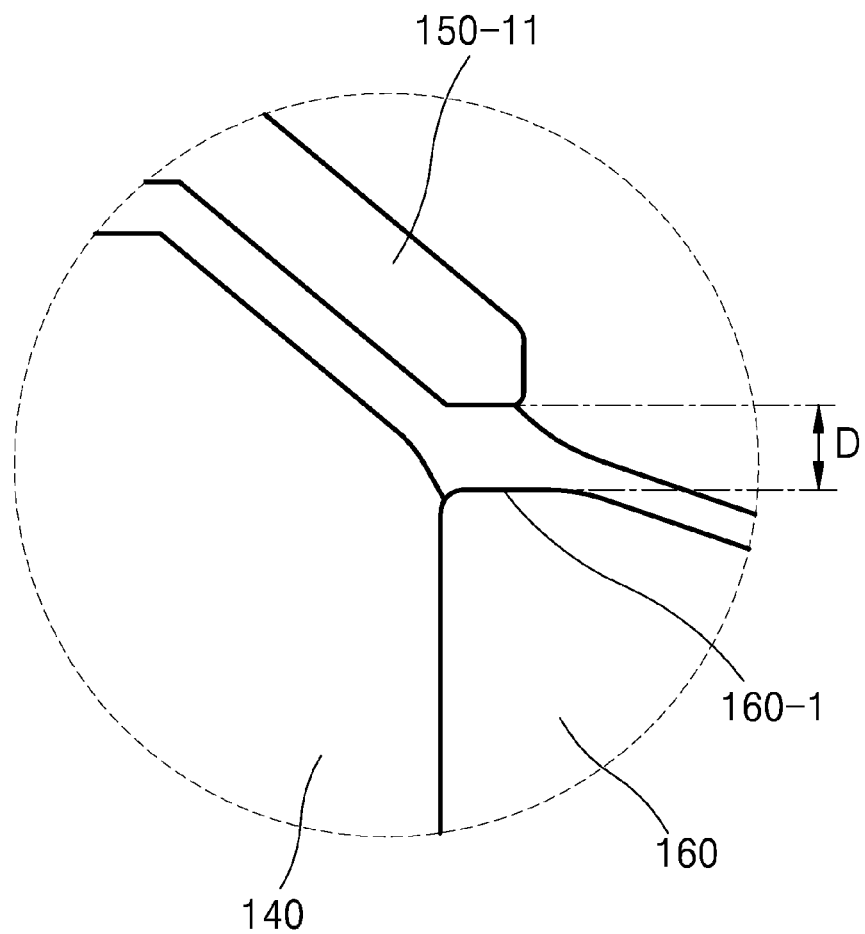
FIG. 4 is a reference diagram for showing a distance between an edge portion of a second electrode frame and an end of any one hook portion of a first electrode frame.

FIG. 4 is a reference diagram for showing a distance between one side of the edge portion 160-1 of the second electrode frame 160 and any one hook portion 150-11 of the first electrode frame 150. Referring to FIG. 4, one side of the edge portion 160-1 of the second electrode frame 160 is spaced at a predetermined distance D from the end of the hook portion 150-11.

Figure 5:
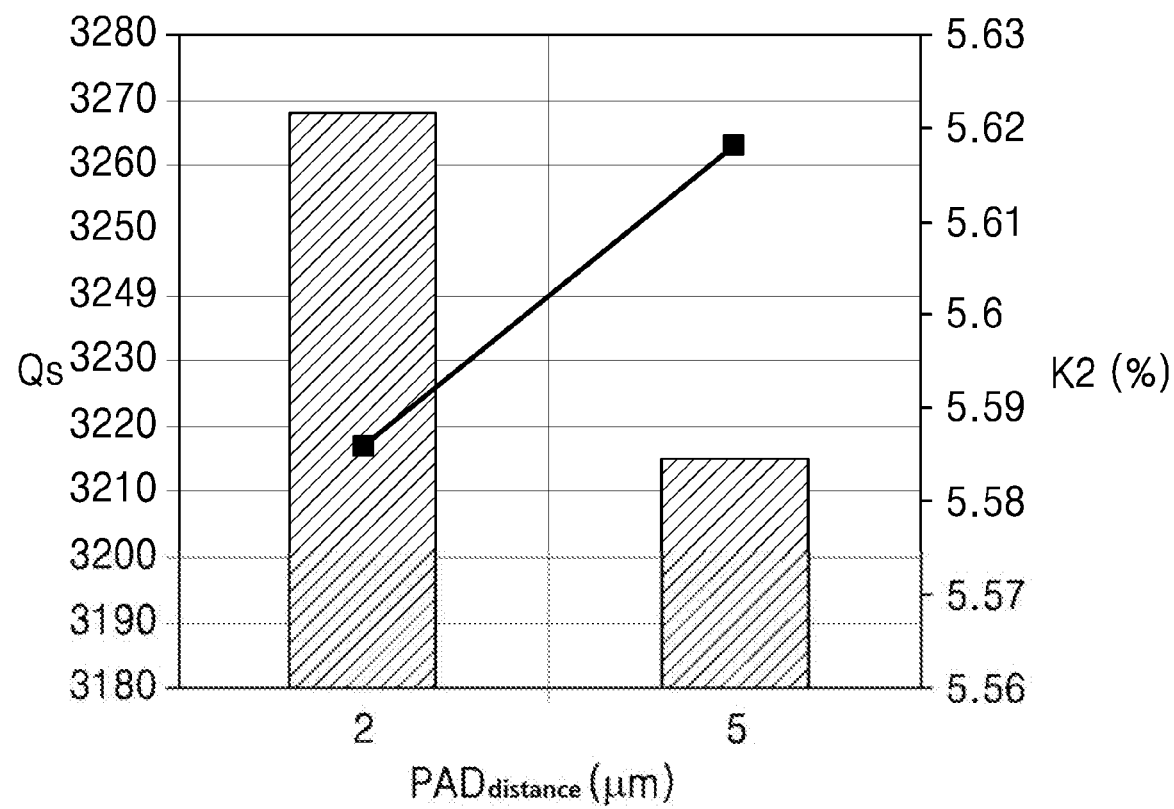
FIG. 5 is a graph of one embodiment of characteristics according to a separation distance between the first electrode frame and the second electrode frame.

FIG. 5 is a graph of one embodiment of characteristics according to a separation distance between the first electrode frame 150 and the second electrode frame 160.

Referring to FIG. 5, as the distance between the first electrode frame 150 and the second electrode frame 160 increases, the quality factor (Qs) decreases but $K^2_{eff}$ increases, as shown in the graph.

Both Qs and $K^2_{eff}$ are important, but when Qs increases, $K^2_{eff}$ decreases, and when Qs decreases, $K^2_{eff}$ increases. Hence, figure of merit (FOM)=Qs*$K^2_{eff}$ is used at times as a performance index. Referring to the graph shown in FIG. 5, comparing a distance of 2 μm versus 5 μm, Qs decreases by 1.68% and $K^2_{eff}$ increases by 0.64%, and thus it can be seen that Qs has more influence, and the distance of 2 μm is more preferable. Therefore, it is preferable that a distance between the first electrode frame 150 and the second electrode frame 160 is designed to be 1 to 2 μm.

The second electrode frame 160 includes the second frame extension portion that is positioned above an upper electrode extension portion of the upper electrode 140 that is extended for connection with the outside.

Referring to the side cross-sectional view shown in FIG. 3, the second frame extension portion 160-2 of the second electrode frame 160 is formed on the upper electrode extension portion 140-2 of the upper electrode 140 that is extended to connection with the outside. The second frame extension portion 160-2 may surround the upper electrode extension portion 140-2 in such a manner that covers the entire upper electrode extension portion 140-2, or may surround only a part of the upper electrode extension portion 140-2.

Figure 6:
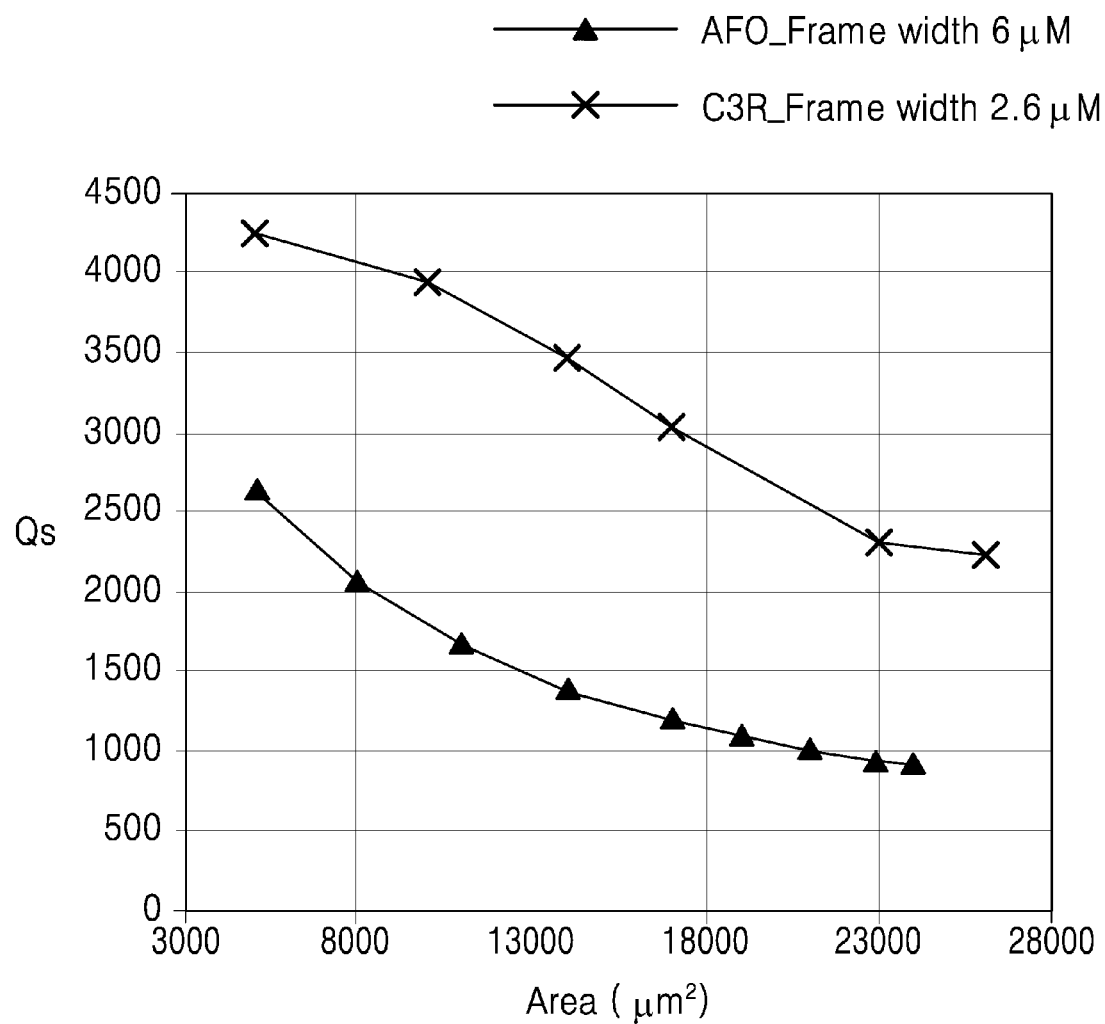
FIG. 6 is a graph illustrating quality factor characteristics of an air-gap type FBAR according to the present invention.

FIG. 6 is a graph illustrating quality factor characteristics of an air-gap type FBAR according to the present invention.

Referring to FIG. 6, it can be seen that quality factor characteristics are improved in the air-gap type FBAR (C3R_Frame width 2.6 µm) according to the present invention compared to the conventional air-gap type FBAR (AFO_Frame width 6 µm). In particular, a value of quality factor for resonance may be increased. A filter incorporating such a resonator may improve insertion loss and the skirt characteristics of the filter.

Figure 7:
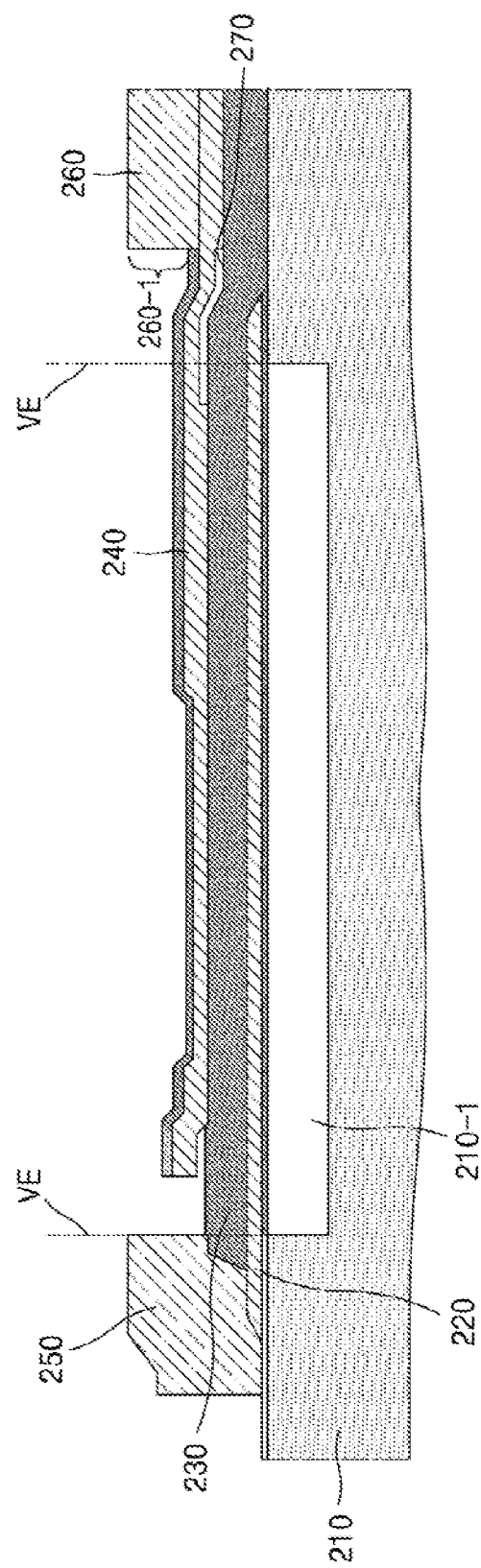
FIG. 7 is a cross-sectional view of a second embodiment of an air-gap type FBAR according to the present invention.

FIG. 7 is a cross-sectional view of a second embodiment of an air-gap type FBAR 200 according to the present invention.

Referring to FIG. 7, the air-gap type FBAR 200 of the second embodiment includes a substrate 210, an air gap portion 210-1, a lower electrode 220, a piezoelectric layer 230, an upper electrode 240, a first electrode frame 250, a second electrode frame 260, and an air bridge 270.

Here, functional characteristics of the substrate 210, the air gap portion 210-1, the lower electrode 220, the piezoelectric layer 230, the upper electrode 240, the first electrode frame 250, and the second electrode frame 260 are substantially the same as or similar to those of the substrate 110, the air gap portion 110-1, the lower electrode 120, the piezoelectric layer 130, the upper electrode 140, the first electrode frame 150, and the second electrode frame 260 described above with reference to FIG. 1. However, the second embodiment is different from the first embodiment in that an edge portion 260-1 of the second electrode frame 260 is not positioned on a virtual edge VE of the air gap portion 210-1, but is set back by a predetermined distance from the virtual edge VE. Meanwhile, the second embodiment 200 further includes the air bridge 270.

Therefore, a description of components that perform common or similar functions will be omitted, and the air bridge 270 will be described below.

The air bridge 270 is an air cavity formed on one side of the virtual edge VE according to the vertical projection of the air gap portion 1. The air cavity of the air gap portion 210-1 may be formed in any one of the piezoelectric layer 230 and the upper electrode 240, or may be formed across both the piezoelectric layer 230 and the upper electrode 240.

Referring to FIG. 7, the air cavity may have an inclined step, as shown in the vertical cross-sectional view, or a horizontal air cavity without a step may be formed. The air bridge 270 is preferably formed on an upper portion of the virtual edge VE of the air gap portion 210-1.

Figure 8:
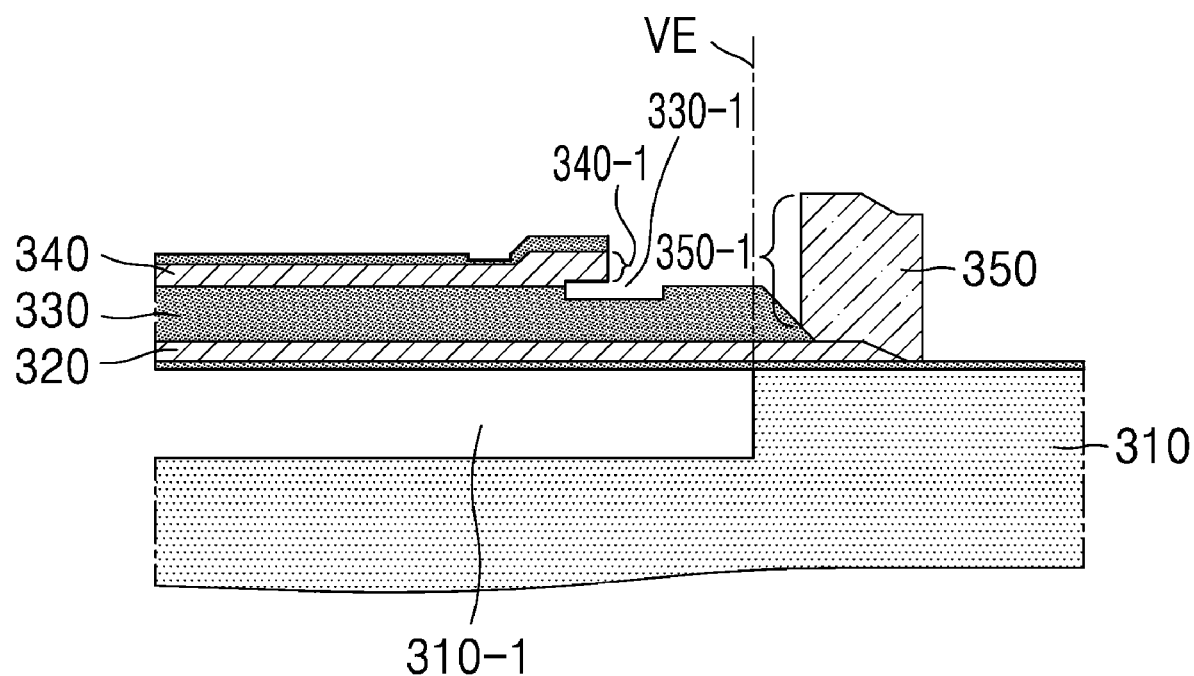
FIG. 8 is a cross-sectional view of a third embodiment of an air-gap type FBAR according to the present invention.

FIG. 8 is a cross-sectional view of a third embodiment of an air-gap type FBAR 300 according to the present invention.

Referring to FIG. 8, the air-gap type FBAR 300 of the third embodiment includes a substrate 310, an air gap portion 310-1, a lower electrode 320, a piezoelectric layer 330, an upper electrode 340, a first electrode frame 350, and a second electrode frame (not shown).

Here, functional characteristics of the substrate 310, the air gap portion 310-1, the lower electrode 320, the upper electrode 340, and the second electrode frame are substantially the same as or similar to those respectively of the substrate 110, the air gap portion 110-1, the lower electrode 120, the upper electrode 140, and the second electrode frame 260 described above with reference to FIG. 1.

Meanwhile, the piezoelectric layer 330 is formed beyond the virtual edge VE to completely surround the air gap portion 310-1. Here, the piezoelectric layer 330 may include a cavity portion formed at a position below the edge portion 340-1 of the upper electrode 340.

Referring to FIG. 8, the piezoelectric layer 330 may include an air space, i.e., a first cavity portion 330-1 with a first piezoelectric cavity, between the lower electrode 320 and the upper electrode 340.

The first cavity portion 330-1 is formed by etching a part of an upper portion of the piezoelectric layer 330 to form the first piezoelectric cavity, depositing and planarizing a sacrificial layer on the first piezoelectric cavity, stacking the upper electrode 340 onto the piezoelectric layer 330 including the sacrificial layer, and then removing the sacrificial layer. Here, for the sacrificial layer, a material that has a high surface roughness and can be easily formed and removed, such as TEOS, PSG, or the like, is used.

The first cavity portion 330-1 may have the first piezoelectric cavity, which is a partial air space in which a part of a lower section of the upper electrode 340 is exposed and an upper section of the lower electrode 320 is not exposed. That is, the first cavity portion 330-1 may include the first piezoelectric cavity having an exposed upper surface formed to expose a part of the lower section of the edge portion 340-1 and a closed lower surface formed to not expose the upper section of the lower electrode 320.

The first cavity portion 330-1 is formed under the edge portion 340-1 that corresponds to an end of the upper electrode 340. Here, the edge portion 340-1 of the upper electrode 340 does not surround the entire upper surface of the first piezoelectric cavity in the first cavity portion 330-1, but surrounds only a part of the first piezoelectric cavity (for example, only about ½ of the first piezoelectric cavity may be surrounded), so that the first cavity portion 330-1 may have a part of an upper portion of the first piezoelectric cavity open.

A thickness of the first cavity portion 330-1 may be less than or equal to half of the thickness of the piezoelectric layer 130. As the first cavity portion 330-1 is formed, each region of the piezoelectric layer 330 varies in thickness. By designing a height of the first cavity portion 330-1 to be less than or equal to half of the thickness of the piezoelectric layer 330, it is possible to secure a minimum thickness that allows heat internally generated to easily escape. In addition, a length of a horizontal width of the first cavity portion 330-1 may be greater than or equal to ¼ of wavelength of energy flowing out through the piezoelectric layer 330.

The first electrode frame 350 has the same or similar structure as the first electrode frame 150 described above in that the first electrode frame 350 corresponds to an electrode frame formed on the lower electrode 320 and has an open ring structure in plane. However, as shown in FIG. 8, the edge portion 350-1 of the first electrode frame 350 in the third embodiment is not positioned on the virtual edge VE of the air gap portion 310-1, but is set back by a predetermined distance from the virtual edge VE and positioned on the lower electrode 320 and.

Figure 9:
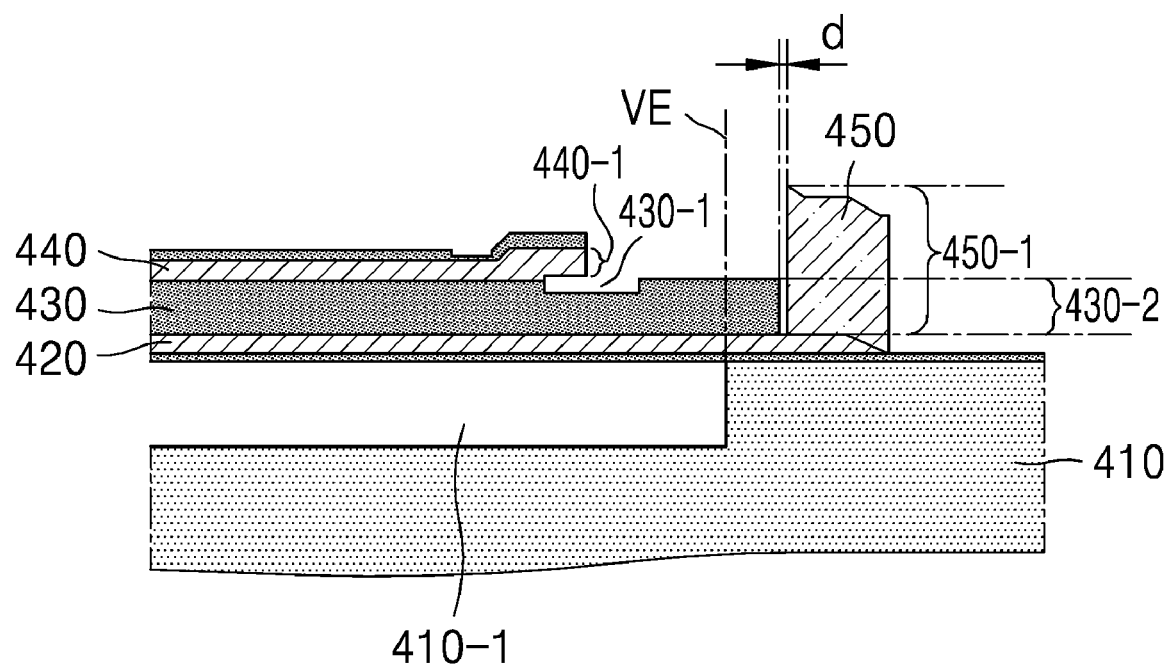
FIG. 9 is a cross-sectional view of a fourth embodiment of an air-gap type FBAR according to the present invention.

FIG. 9 is a cross-sectional view of a fourth embodiment of an air-gap type FBAR 400 according to the present invention.

Referring to FIG. 9, the air-gap type FBAR 400 of the fourth embodiment includes a substrate 410, an air gap portion 410-1, a lower electrode 420, a piezoelectric layer 430, an upper electrode 440, a first electrode frame 450, and a second electrode frame (not shown).

Here, functional characteristics of the substrate 410, the air gap portion 410-1, the lower electrode 420, the upper electrode 440, and the second electrode frame are substantially the same as or similar to those respectively of the substrate 310, the air gap portion 310-1, the lower electrode 320, the upper electrode 340, and the second electrode frame described above with reference to FIG. 8.

Meanwhile, the piezoelectric layer 430 is formed beyond the virtual edge VE to completely surround the air gap portion 410-1. Here, the piezoelectric layer 430 may include a first cavity portion 430-1 having a first piezoelectric cavity formed at a position below an edge portion 440-1 of the upper electrode 440. Functional characteristics of the first cavity portion 430-1 are the same as those of the first cavity portion 330-1 described above with reference to FIG. 8. However, the piezoelectric layer 430 extends beyond the virtual edge VE, and an edge portion 430-2 of the piezoelectric layer 430 that corresponds to an end of the extended portion forms a right-angled boundary wall. The edge portion 430-2 of the piezoelectric layer 430 is spaced at a predetermined distance d from an edge portion 450-1 of the first electrode frame 450. The predetermined distance d may vary depending on the design.

The first electrode frame 450 has the same or similar structure as the first electrode frame 150 described above in that the first electrode frame 450 corresponds to an electrode frame formed on the lower electrode 420 and has an open ring structure in plane. However, as shown in FIG. 9, the edge portion 450-1 of the first electrode frame 450 in the fourth embodiment is not positioned on the virtual edge VE of the air gap portion 410-1, but is set back by a predetermined distance from the virtual edge VE and positioned on the lower electrode 420.

Figure 10:
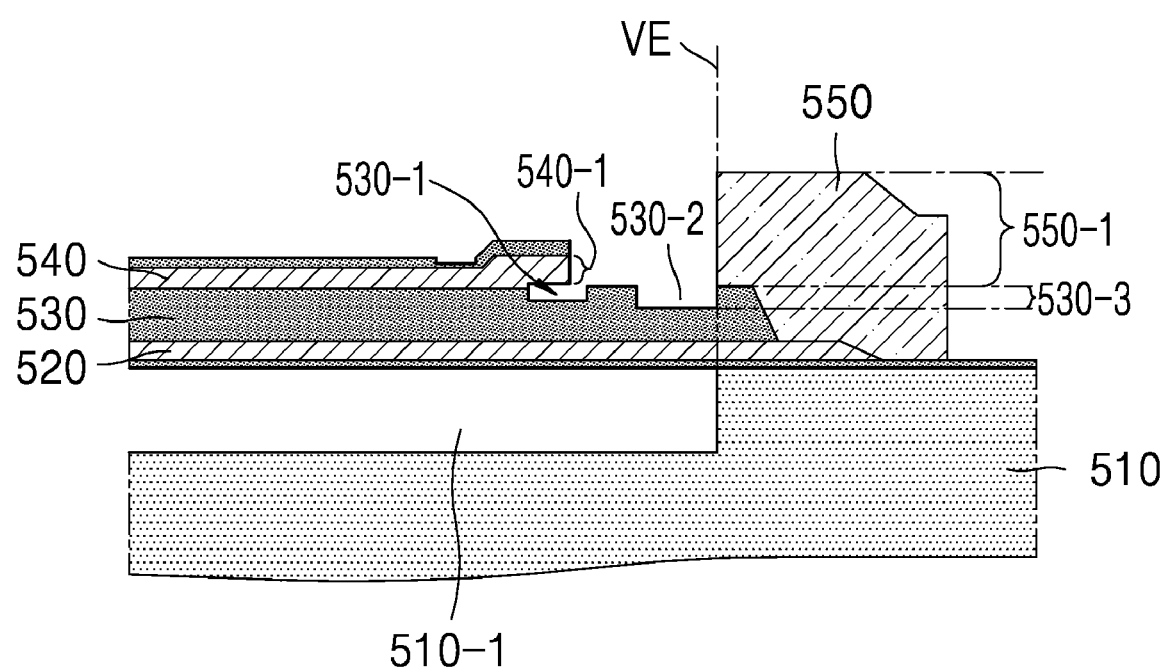
FIG. 10 is a cross-sectional view of a fifth embodiment of an air-gap type FBAR according to the present invention.

FIG. 10 is a cross-sectional view of a fifth embodiment of an air-gap type FBAR 500 according to the present invention.

Referring to FIG. 10, the air-gap type FBAR 500 of the fifth embodiment includes a substrate 510, an air gap portion 510-1, a lower electrode 520, a piezoelectric layer 530, an upper electrode 540, and a first electrode frame 550, and a second electrode frame (not shown).

Here, the functional characteristics of the substrate 510, the air gap portion 510-1, the lower electrode 520, the upper electrode 540, and the second electrode frame are substantially the same as or similar to those respectively of the substrate 310, the air gap portion 310-1, the lower electrode 320, the upper electrode 340, and the second electrode frame described above with reference to FIG. 8.

Meanwhile, the piezoelectric layer 530 is formed beyond the virtual edge VE to completely surround the air gap portion 510-1. Here, the piezoelectric layer 530 may include a first cavity portion 530-1 having a first piezoelectric cavity formed at a position below an edge portion 540-1 of the upper electrode 540. Functional characteristics of the first cavity portion 530-1 are the same as those of the first cavity portion 330-1 described above with reference to FIG. 8. However, as shown in FIG. 10, the piezoelectric layer 530 further includes a second cavity portion 530-1 in addition to the first cavity portion 530-1.

The second cavity 530-2 includes a second piezoelectric cavity formed to be spaced at a predetermined distance from the first cavity 530-1. The second piezoelectric cavity of the second cavity portion 530-2 may include a closed lower surface formed to not expose an upper section of the lower electrode 520 and an exposed upper surface formed to allow the entire upper portion to be open.

A boundary wall 530-3 at one side of the second piezoelectric cavity of the second cavity portion 530-2 is located at a point coincident with an edge portion 550-1 of the first electrode frame 550 and a virtual edge VE of the air gap portion 210-1.

Similar to the first cavity portion 530-1, a thickness of the second cavity portion 530-2 may be less than or equal to half of the thickness of the piezoelectric layer 530. As the first cavity portion 530-1 and the second cavity portion 530-2 are formed on the piezoelectric layer 530, each region of the piezoelectric layer 330 varies in thickness. In addition, a length of a horizontal width of the first cavity portion 530-1 or the second cavity portion 530-2 may be greater than or equal to ¼ of wavelength of energy flowing out through the piezoelectric layer 530. A difference in acoustic impedance due to variation in thickness of the piezoelectric layer 530 may prevent the leakage of energy escaping from the piezoelectric layer 530 in the lateral direction.

The first electrode frame 550 has the same or similar structure as the first electrode frame 150 described above in that the first electrode frame 550 corresponds to an electrode frame formed on the lower electrode 520 and the piezoelectric layer 530 and has an open ring structure in plane. In addition, as shown in FIG. 10, the edge portion 550-1 of the first electrode frame 550 in the fifth embodiment is positioned on the virtual edge VE of the air gap portion 510-1 and the boundary wall 530-3 of one side of the second cavity portion 530-2.

Figure 11:
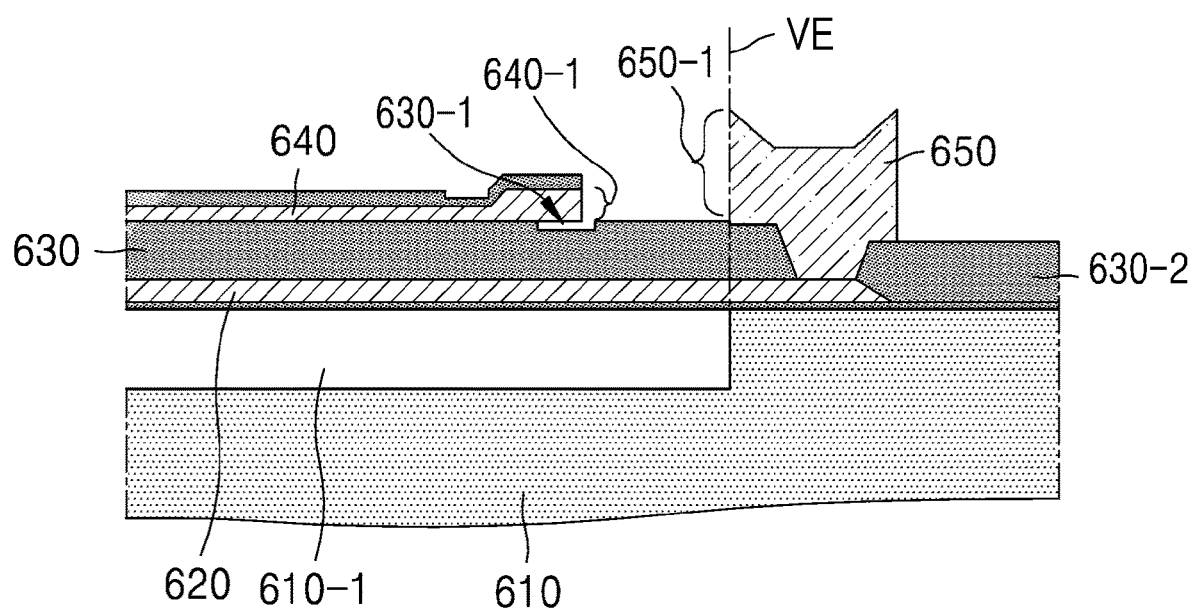
FIG. 11 is a cross-sectional view of a sixth embodiment of an air-gap type FBAR according to the present invention.

FIG. 11 is a cross-sectional view of a sixth embodiment of an air-gap type FBAR 600 according to the present invention.

Referring to FIG. 11, the air-gap type FBAR 600 of the sixth embodiment includes a substrate 610, an air gap portion 610-1, a lower electrode 620, a piezoelectric layer 630, an upper electrode 640, a first electrode frame 650, and a second electrode frame (not shown).

Here, the functional characteristics of the substrate 610, the air gap portion 610-1, the lower electrode 620, the upper electrode 640, and the second electrode frame are substantially the same as or similar to those respectively of the substrate 110, the air gap portion 110-1, the lower electrode 120, the upper electrode 140, and the second electrode frame described above with reference to FIG. 1.

Meanwhile, the piezoelectric layer 630 is formed beyond the virtual edge VE to completely surround the air gap portion 610-1. Here, the piezoelectric layer 630 may include a first cavity portion 630-1 having a first piezoelectric cavity formed at a position below an edge portion 640-1 of the upper electrode 640. Functional characteristics of the first cavity portion 630-1 are the same as those of the first cavity portion 330-1 described above with reference to FIG. 8.

The piezoelectric layer 630 is formed on the lower electrode 620, and at this time, an edge portion of the piezoelectric layer 630 is formed to be inclined in the vicinity of a virtual edge VE according to the vertical projection of the air gap portion 610-1. In addition, an extended piezoelectric layer 630-2 is additionally formed on the substrate 610 on which the lower electrode 620 is not stacked after an end of a portion of the piezoelectric layer 630 extending beyond the virtual edge VE is cut away. The extended piezoelectric layer 630-2 is a piezoelectric layer that restarts at a point spaced a predetermined distance apart from an edge portion of the piezoelectric layer 130 and extends therefrom. In this way, as the extended piezoelectric layer 630-2 is additionally formed on the substrate 610 on which the lower electrode 620 is not stacked, an upper portion (seed layer) of the substrate 610 is prevented from exposure to a release solution for formation of the air gap portion 610-1.

The first electrode frame 650 has the same or similar structure as the first electrode frame 150 described above in that the first electrode frame 650 corresponds to an electrode frame formed on the lower electrode 620 and has an open ring structure in plane. An edge portion 650-1 of the first electrode frame 650 is located at a point corresponding to the virtual edge VE of the air gap portion 110-1. However, the first electrode frame 650 is different from the first electrode frame 150 of FIG. 1 that is stacked on the lower electrode 120 and the substrate 110 in that the first electrode frame 650 is stacked on the piezoelectric layer 630 and the lower electrode 620 and the piezoelectric layer 630 is stacked also on an extended piezoelectric layer 630-2 additionally stacked.

According to the present invention, in a resonator structure, a piezoelectric layer is formed to conform to edges of a resonator, wherein the first electrode frame is formed on the lower electrode and the piezoelectric layer and the second electrode frame is formed on the upper electrode. Accordingly, the current of the lower electrode and the upper electrode gathers and flows to the first electrode frame and the second electrode frame that have low resistance, so that resistance can be significantly reduced and in addition to such an electrical benefit, heat generated at the time of high power driving can be easily dissipated in the piezoelectric layer. Accordingly, electrode resistance occurring at the lower electrode and the upper electrode is minimized, thereby improving quality factor.

Also, the first electrode frame and the second electrode frame cover the electrodes, and hence can be used as passivation to protect the electrodes.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

REFERENCE NUMERALS 100, 200, 300, 400, 500, 600: AIR-GAP TYPE FBAR
110, 210, 310, 410, 510, 610: SUBSTRATE
110-1, 210-1, 310-1, 410-1, 510-1, 610-1: AIR GAP PORTION
120, 220, 320, 420, 520, 620: LOWER ELECTRODE
130, 230, 330, 430, 530, 630: PIEZOELECTRIC LAYER
140, 240, 340, 440, 540, 640: UPPER ELECTRODE
150, 250, 350, 450, 550, 650: FIRST ELECTRODE FRAME
160, 260: SECOND ELECTRODE FRAME

What is claimed is:

1. An air-gap type film bulk acoustic resonator (FBAR) comprising:
    a substrate which comprises an air gap portion having a substrate cavity formed in a top surface;
    a lower electrode formed on the substrate and extending beyond opposing sides of the air gap portion in the substrate;
    a piezoelectric layer which is formed on the lower electrode and has one side forming an edge portion in the vicinity of a virtual edge according to vertical projection of the air gap portion;
    an upper electrode formed on the piezoelectric layer;
    a first electrode frame which comprises an open ring structure in plane, the open ring structure surrounding a part of a periphery of the piezoelectric layer on the lower electrode; and
    a second electrode frame positioned on the upper electrode and adjacent to an open portion of the open ring structure, wherein a distance between the first electrode frame and the second electrode frame is equal to a distance between the opposing sides of the air gap portion in the substrate.

2. The air-gap type FBAR of claim 1, wherein the open ring structure surrounds a part of the virtual edge according to the vertical projection of the air gap portion and the second electrode frame is spaced a predetermined distance from the first electrode frame and surrounds the remaining portion of the virtual edge.

3. The air-gap type FBAR of claim 2, wherein the first electrode frame comprises the open ring structure which is formed on the lower electrode and spaced apart from an edge portion of the upper electrode and surrounds the virtual edge.

4. The air-gap type FBAR of claim 2, wherein the first electrode frame comprises the open ring structure having the edge portion positioned along the virtual edge.

5. The air-gap type FBAR of claim 2, wherein the open ring structure comprises two hook portions bent to face each other at both ends thereof and an edge portion of the second electrode frame is positioned between the hook portions.

6. The air-gap type FBAR of claim 2, wherein the first electrode frame comprises a first frame extension portion formed on a lower electrode extension portion of the lower electrode that extends for connection with the outside.

7. The air-gap type FBAR of claim 2, wherein an edge portion of the second electrode frame is positioned along the virtual edge.

8. The air-gap type FBAR of claim 2, wherein the second electrode frame comprises a second frame extension portion formed on an upper electrode extension portion of the upper electrode that extends for connection with the outside.

9. The air-gap type FBAR of claim 2, wherein the first electrode frame is formed on the lower electrode and when the piezoelectric layer extends beyond the virtual edge and completely surrounds the air gap portion, an edge portion of the first electrode frame is spaced a predetermined distance from the edge portion of the piezoelectric layer.

10. The air-gap type FBAR of claim 2, wherein the piezoelectric layer further comprises a cavity portion comprising a piezoelectric cavity formed between the lower electrode and the upper electrode and the cavity portion is formed on a lower portion of an edge portion of the upper electrode.

11. The air-gap type FBAR of claim 10, wherein the cavity portion is a first cavity portion comprising a first piezoelectric cavity having an exposed upper surface formed to expose a part of a lower section of the edge portion of the upper electrode and a closed lower surface formed to not expose an upper section of the lower electrode.

12. The air-gap type FBAR of claim 10, wherein the piezoelectric layer further comprises a second cavity portion comprising a second piezoelectric cavity formed to be spaced a predetermined distance from the first cavity portion.

13. The air-gap type FBAR of claim 12, wherein the second piezoelectric cavity has a closed lower surface formed to not expose an upper section of the lower electrode and an exposed upper surface formed to allow an entire upper portion to be open.

14. The air-gap type FBAR of claim 13, wherein the first electrode frame comprises an edge portion which is coincident with a boundary wall of one side of the second piezoelectric cavity when the piezoelectric layer extends beyond the virtual edge and completely surrounds the air gap portion.

15. The air-gap type FBAR of claim 1, further comprising an air bridge which comprises an air cavity formed on one side of the virtual edge according to the virtual projection of the air gap portion.

16. The air-gap type FBAR of claim 1, wherein the piezoelectric layer comprises the edge portion formed vicinity of the virtual edge according to the virtual projection of the air gap portion and further comprises an extended piezoelectric layer which is spaced a predetermined distance or more apart from the edge portion and extends, and the first electrode frame is formed on the extended piezoelectric layer as well as on the piezoelectric layer and the lower electrode.

* * * * *